United States Patent [19]
Ema et al.

[11] Patent Number: 4,807,017
[45] Date of Patent: Feb. 21, 1989

[54] SEMICONDUCTOR MEMORY DEVICE WITH WIRINGS HAVING ENSURED CROSS-SECTIONS

[75] Inventors: Taiji Ema, Kawasaki; Takashi Yabu, Yokohama, both of Japan

[73] Assignee: Fujitsu Limited, Kanagawa, Japan

[21] Appl. No.: 203,634

[22] Filed: Jun. 6, 1988

Related U.S. Application Data

[63] Continuation of Ser. No. 802,100, Nov. 25, 1985.

[30] Foreign Application Priority Data

Nov. 26, 1984 [JP] Japan ................... 59-248946

[51] Int. Cl.⁴ ............. H01L 23/48; H01L 27/02; H01L 27/10; H01L 29/04
[52] U.S. Cl. ..................... 357/68; 357/41; 357/45; 357/59; 357/71
[58] Field of Search ........... 357/41, 45, 59 J, 68, 357/23.6, 71 R

[56] References Cited

U.S. PATENT DOCUMENTS 3,946,421  3/1976  Hartsell et al. ............. 357/24
4,001,871  1/1977  Tsunemitsu ................. 357/54
4,206,471  6/1980  Hoffmann et al. ........... 357/45
4,328,563  5/1982  Schroeder .................. 357/41
4,536,941  8/1985  Kuo et al. ................. 357/51

FOREIGN PATENT DOCUMENTS 112670  3/1979  European Pat. Off. .
 33130  2/1981  European Pat. Off. .
2390009  4/1978  France .

OTHER PUBLICATIONS

Terman, L. M. "Aluminum-Silicon Self-Aligned Gate 1-Device Cell with Narrow Word Line Pitch" IBM Technical Disclosure Bulletin, vol. 15, No. 4, Sep. 1972, pp. 1163-1164.

Primary Examiner—Martin H. Edlow
Assistant Examiner—Robert P. Limanek
Attorney, Agent, or Firm—Armstrong, Nikaido, Marmelstein & Kubovcik

[57] ABSTRACT

In a memory cell matrix region of a semiconductor memory device such as a dynamic RAM or a static RAM, wirings of the same material are distributed between different layers in such a manner that the upper wirings overlap the lower wirings. Accordingly, the width of the wirings can be increased for a semiconductor memory device having a high concentration and high integration.

4 Claims, 8 Drawing Sheets

Fig. I

SEMICONDUCTOR MEMORY DEVICE WITH WIRINGS HAVING ENSURED CROSS-SECTIONS

This application is a continuation of application Ser. No. 802,100 filed Nov. 25, 1985.

BACKGROUND OF THE INVENTION

1. Field of the Invention

The present invention relates to a semiconductor memory device with wirings having ensured cross-sections. The semiconductor device is used in a dynamic random-access memory (RAM), a static RAM, or a read-only memory (ROM).

2. Description of the Related Art

In a conventional dynamic RAM (DRAM), a plurality of parallel data lines are constituted by a single aluminum film.

With a structure wherein a plurality of data lines are formed by a wiring material such as a single aluminum film, the pitch of the plurality of data lines must be reduced to achieve a high-density DRAM having fine memory cells with a high packing density. As a result, the width of each of the data lines must be decreased.

Assume that the wiring pitch is 3.5 µm. In this case, when the width of a contact pad is larger than the wiring width by, for example, 0.5 µm, the wiring width is increased to 1.5 µm and the wiring interval is accordingly 1.5 µm. These values are given in a conventional 250-Kbit or 1-Mbit DRAM.

When the packing density of the DRAM is increased and the wiring pitch is decreased to 2.1 µm to 1.5 µm, the wiring width and the wiring interval must be decreased to about 0.8 µm to 0.5 µm under the condition wherein the same margin (i.e., 0.5 µm larger than the wiring width) as described above is given to the contact pad.

In a very large-scale semiconductor memory device of a DRAM of which a structure of high concentration and high integration is required, with such a wiring structure, the wiring width is greatly decreased, the cross-sections of the wirings are greatly decreased, the wiring resistance is increased, and hence the electromigration effect is increased. Accordingly, the operation speed and the reliability of the semiconductor memory device are deteriorated.

SUMMARY OF THE INVENTION

It is the object of the present invention to provide a new and improved semiconductor memory device wherein a large width of each wiring can be ensured, a cross-section thereof is maintained to be larger than a predetermined value, and the operation speed and the reliability of the device are not deteriorated even if the device is highly integrated.

According to the present invention, there is provided a semiconductor memory device including: a semiconductor substrate; a plurality of memory cell structures formed on the semiconductor substrate; a plurality of wiring groups formed above the memory cell structures for providing data lines for predetermined functions, wirings of the wiring group extending in parallel along a predetermined direction; and insulating interlayers between wirings of the wiring groups. Wirings of one of the wiring groups for a predetermined function are distributed between an upper layer and an lower layer separated by one of the insulating interlayers, and wirings distributed in the upper layer are arranged in an overlapped relationship with regard to wirings distributed in the lower layer.

DESCRIPTION OF THE PREFERRED EMBODIMENT

Figure 1:
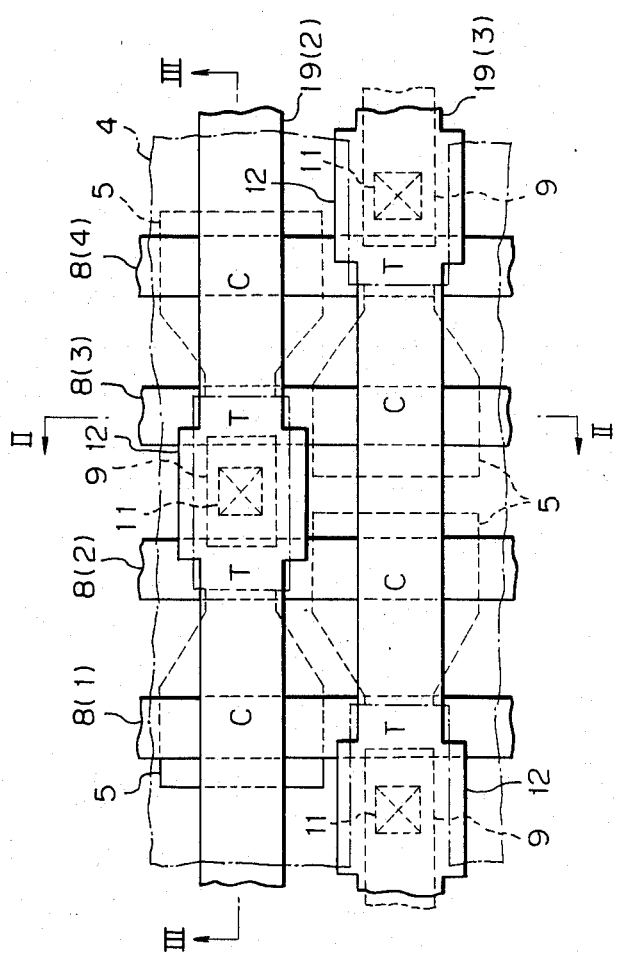
FIG. 1 is a plan view showing the main part of a conventional semiconductor memory device.
Figure 2:
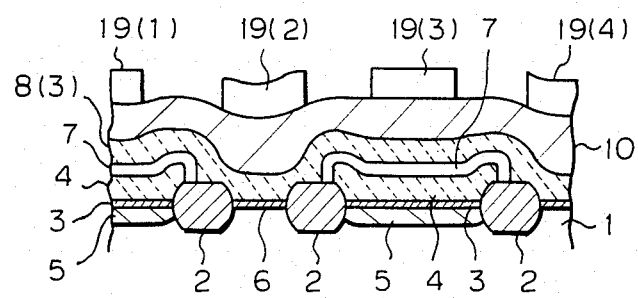
FIG. 2 is a sectional view thereof taken along the line II—II of FIG. 1.
Figure 3:
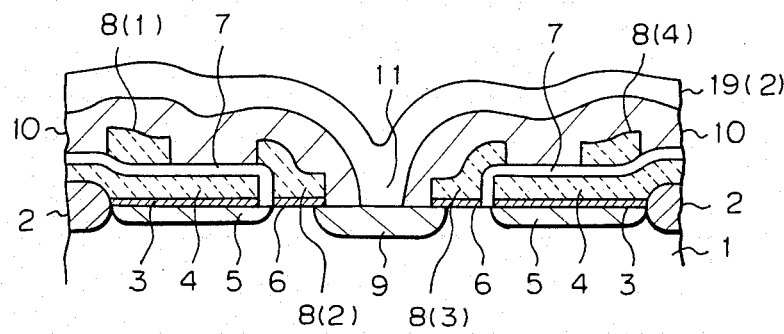
FIG. 3 is a sectional view thereof taken along the line III—III of FIG. 1.
Figure 4:
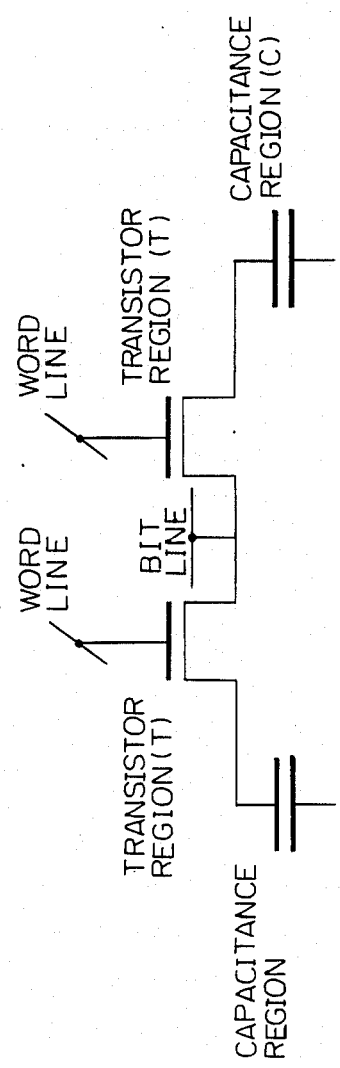
FIG. 4 shows the circuit structure of the device of FIG. 1.

Before entering into a description of the embodiment, a prior art DRAM will be described with reference to FIGS. 1 to 4. FIGS. 2 and 3 are sectional views of the conventional DRAM of FIG. 1 taken along the lines II—II and III—III. FIG. 4 shows the circuit structure of the device of FIG. 1. Reference numeral 1 denotes a p type silicon substrate; 2 an element isolation oxide film; 3 a silicon dioxide ($SiO_2$) dielectric film; 4 a capacitor electrode of a first polycrystalline silicon layer; 5 an $n^+$ type region as one electrode of the capacitor; 6 a gate oxide film; 7 an $SiO_2$ insulating film; 8(1), 8(2), 8(3), and 8(4) address lines (gate electrodes) of a second polycrystalline silicon layer, respectively; 9 an $n^+$ type drain region; 10 a phosphosilicate glass (PSG) insulating interlayer; 11 a contact hole; 12 a contact pad; and 19(1), 19(2), 19(3), and 19(4) data lines of a single aluminum film. The transistor regions T, the capacitance region C, the word lines, and a bit line in FIG. 1 are shown correspondingly in the circuit structure of FIG. 4.

In the prior art DRAM shown in FIGS. 1 to 4, the parallel data lines 19(1) to 19(4) are constituted by a single aluminum film.

However, in the structure wherein the data lines 19(1) to 19(4) are constituted by the single wiring material layer, e.g., the aluminum film in this example, the interval of the data lines 19(1) to 19(4) is decreased, and the width of each of the data lines 19(1) to 19(4) must be decreased accordingly upon further micropatterning of the memory cells.

In the structure shown in FIGS. 1 to 4, when the wiring pitch is given as 3.5 µm and a width of the contact pad 12 is increased to be larger by, for example, 0.5 µm than that of the wiring width, the wiring width and the wiring interval are given as 1.5 µm. This width has been used in conventional 256 Kbit or 1 Mbit DRAM's. When the DRAM is highly integrated and the wiring pitch is decreased to about 2.0 to 1.5 μm, the wiring width and the wiring interval must be decreased to 0.75 to 0.5 μm when the margin of the contact pad is given as described above.

A semiconductor memory device according to an embodiment of the present invention is illustrated in FIGS. 5 to 8.

Figure 5:
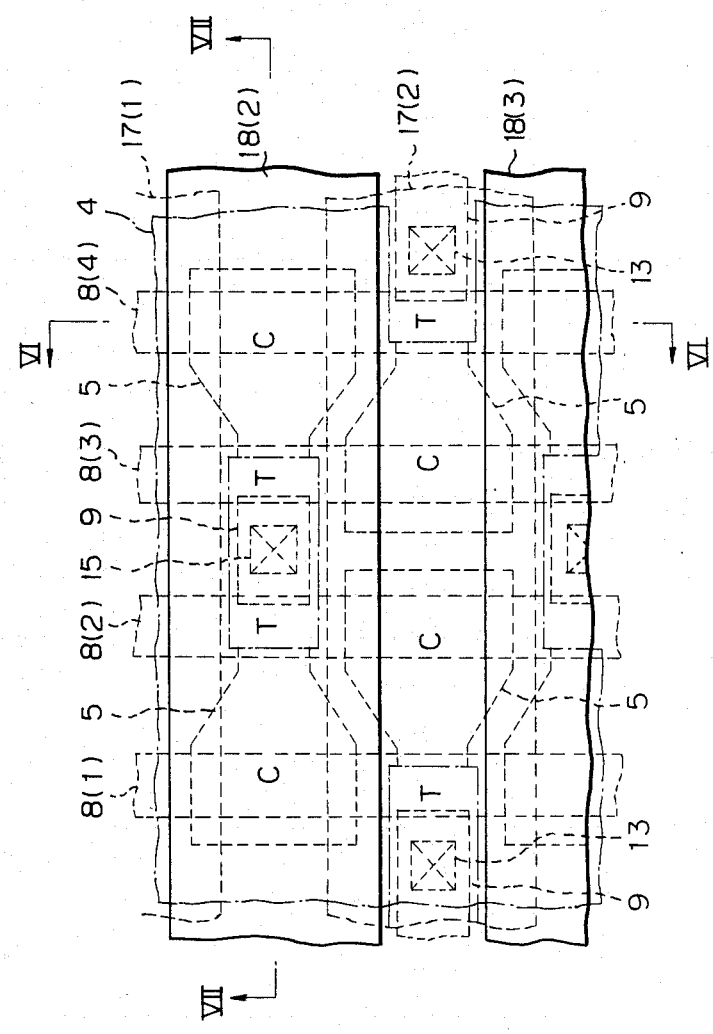
FIG. 5 is a plan view showing the main part of a DRAM according to an embodiment of the present invention.
Figure 6:
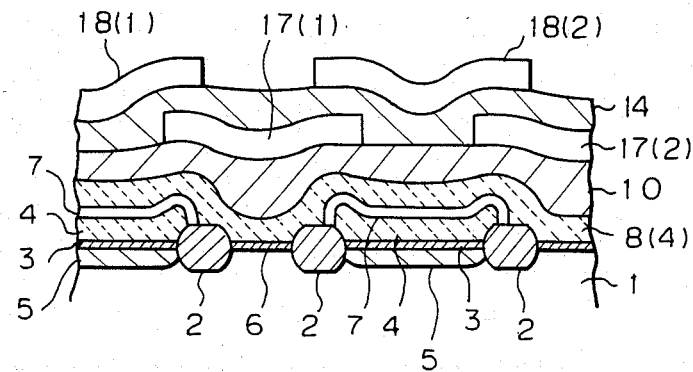
FIG. 6 is a sectional view thereof taken along the line VI—VI of FIG. 5.
Figure 7:
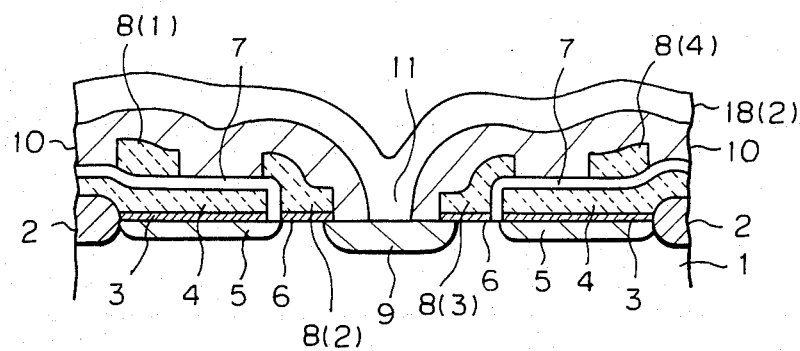
FIG. 7 is a sectional view thereof taken along the line VII—VII of FIG. 5.
Figure 8:
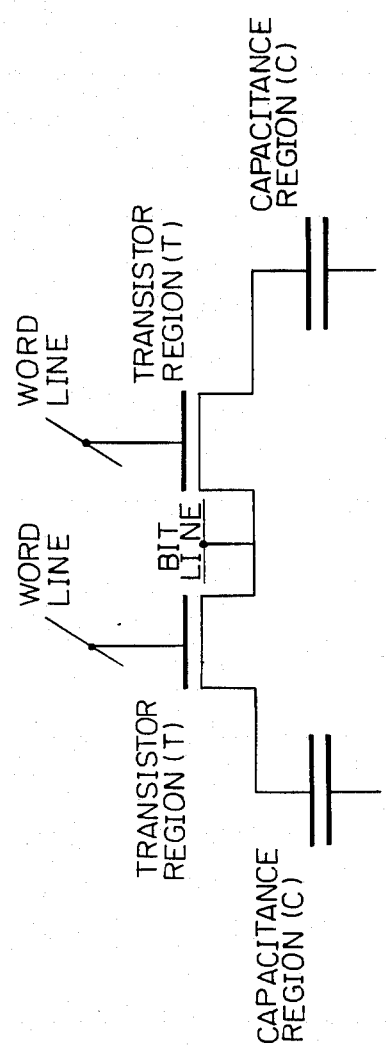
FIG. 8 shows the circuit structure of the device of FIG. 5.
Figure 9A:
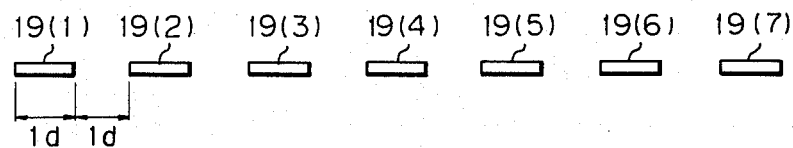
FIGS. 9A and 9B are sectional views of a prior art wiring portion and a wiring portion of the DRAM of FIG. 5.
Figure 9B:
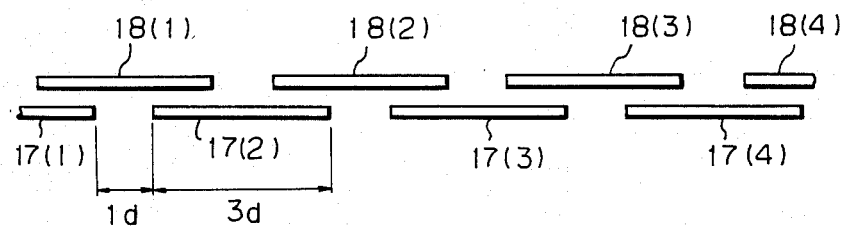

FIG. 5 is a plan view of a DRAM, and FIG. 6 is a sectional view thereof taken along the line VI—VI of FIG. 5. A wiring portion of the prior art DRAM and that of the DRAM of FIG. 5 are illustrated in FIGS. 9A and 9B. FIG. 8 shows the circuit structure of the device of FIG. 5. FIG. 9 shows a modification of the wiring pattern.

Referring to FIGS. 5 to 8, reference numeral 1 denotes a p type silicon substrate; 2 an element isolation oxide film; 3 an $SiO_2$ dielectric film; 4 a capacitor electrode of a first polycrystalline silicon layer PA; 5 an n+ type region serving as one electrode of the capacitor; 6 a gate oxide film; 7 an $SiO_2$ insulating film; 8(1), 8(2), 8(3), and 8(4) gate electrodes serving as address lines made of a second polycrystalline silicon layer PB, respectively; 9 an n+ type drain region; 10 a first PSG insulating interlayer; 13 a contact hole between a lower wiring layer and the drain region 9; 14 a second PSG insulating interlayer; and 15 a contact hole between the upper wiring layer and the drain region 9. Reference numerals 17(2) and 17(1) are lower data lines made of a lower aluminum film, respectively; 18(2) and 18(1) are upper data lines made of an upper aluminum film. Each memory cell includes one transistor T and one capacitor C as in the prior art device.

In the DRAM shown in FIG. 5, the plurality of parallel data lines sequentially constituted by a wiring layer of a single wiring material such as aluminum are alternately formed by the upper and lower aluminum films insulated through the second insulating interlayer 14 in an order of 17(2), 18(2), 17(1), and 18(1). Further, the data lines 18(2) and 18(1) formed by the upper aluminum film overlap the adjacent data lines of the lower aluminum film, respectively.

As shown in FIG. 9A, a prior art structure has data lines of a single layer. Assume that parallel data lines 19(1), 19(2), ... 19(7) are formed in a wiring region at a wiring width of 1d and a wiring interval of 1d. However, as shown in FIG. 9B, the data lines 18(1), 17(2), 18(2), 17(3), 18(3), 17(4), and 18(4) can be formed in the same wiring area as that of the conventional DRAM at a wiring width of 3d and a wiring interval of 1d. Therefore, the wiring width of the data line of the DRAM of this embodiment can be increased to three times that of the prior art DRAM.

Figure 10:
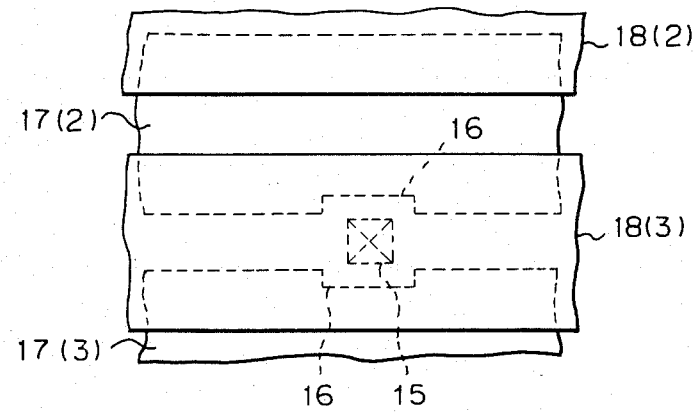
FIG. 10 is a plan view showing a modification of the wiring pattern.

As shown in FIG. 10, for example, recesses 16 may be formed in the lower data lines 17(2) and 17(3) to detour the contact hole 15 formed between the upper data lines 18(2) and 18(3). In this case, the width of the lower data lines 17(2) and 17(3) can be larger than that shown in FIG. 5 up to that defined by a maximum interval defined by insulation and connection of the wirings of an identical layer.

However, the upper data lines 18(2) and 18(3) do not have the limits described above, so the wiring interval can be maximized in association with a minimum wiring interval.

Figure 11:
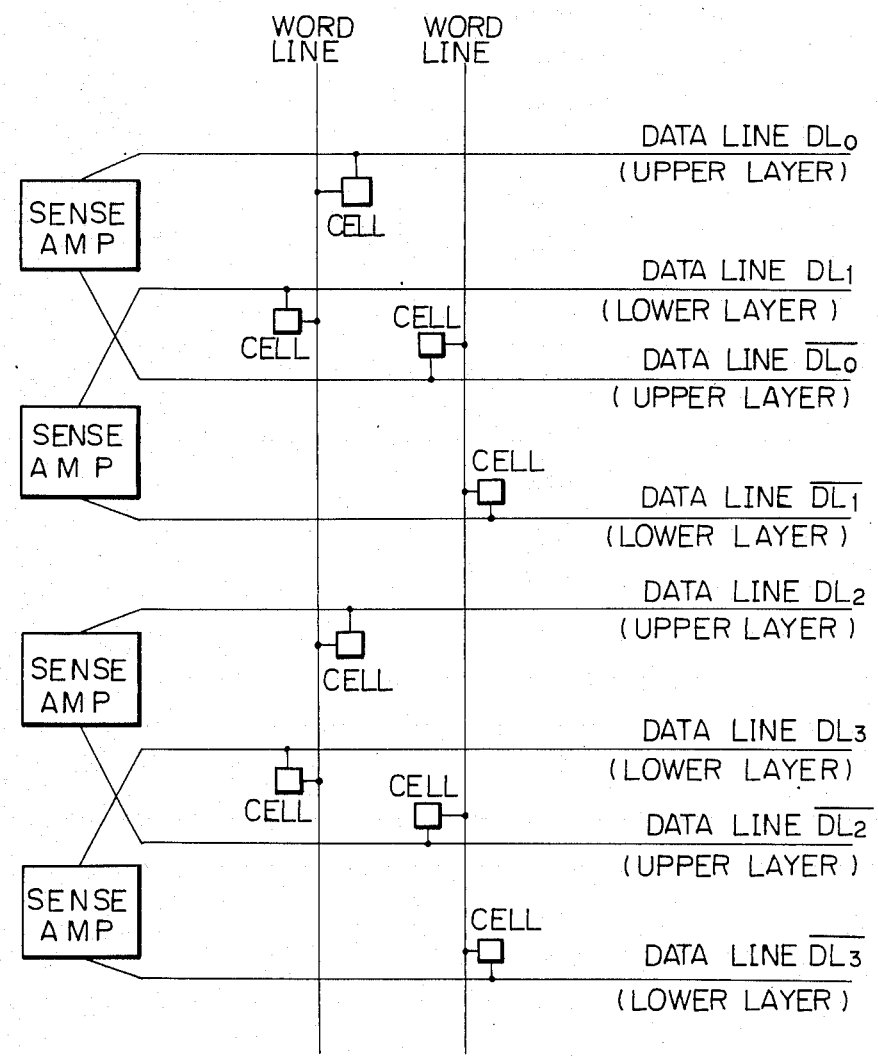
FIG. 11 shows a circuit diagram applicable to the device according to the present invention.

A preferred circuit diagram applicable to the device according to the present invention in connection with sense amplifiers is shown in FIG. 11.

The circuit arrangement shown in FIG. 11 requires a slight modification of the layout structure of FIG. 5, but has an advantage of a superior symmetrization of electrical characteristic between data line pair associated with a sense amplifier, which is desirable in DRAMs. Data lines $DL_0$ and $\overline{DL}_0$ connected with the first sense amplifier are located in the upper layer. Data lines $DL_1$ and $\overline{DL}_1$ connected with the second sense amplifier are located in the lower layer. In the circuit arrangement of FIG. 11, where the data lines are divided into a first group of data lines DL and a second group of data lines $\overline{DL}$, the characteristic of symmetry between the data lines is attained satisfactorily.

The present invention is exemplified by a DRAM. However, the present invention can also be applied to other semiconductor memory devices such as static RAM's and static ROM's.

The wiring material is not limited to aluminum, but can be extended to any other proper material.

We claim:

1. A semiconductor memory device comprising:
   a semiconductor substrate;
   a plurality of memory cell structures formed on said semiconductor substrate, each memory cell having a transistor which has a drain region;
   a plurality of wiring groups formed above said memory cell structures, said wiring groups forming data line wirings, which extend parallel along a first predetermined direction, an forming word line wirings, which extend in parallel along a second predetermined direction; and
   insulating layers provided between said wirings of said wiring groups, said data line wirings being distributed between an upper layer and a lower layer, said upper layer and said lower layer being separated by one of said insulating layers, said upper and lower layers being formed from the same material, said data line wirings distributed in said upper layer being arranged in an overlapping relationship with regard to said data line wirings distributed in said lower layer, wherein said data line wirings contact said drain regions of said transistors of associated memory cells, respectively.

2. A device according to claim 1, wherein said wirings of one of said wiring groups for a predetermined function are the wirings for said data lines.

3. A device according to claim 1, wherein said wirings of one of said wiring groups for a predetermined function are the wirings contacting a gate electrode of said memory cell structures forming word lines.

4. A device according to claim 1, wherein each of said memory cell structures comprises said transistor structure and a capacitance structure.

* * * * *